US012457777B2

(12) United States Patent
Kim et al.

(10) Patent No.: US 12,457,777 B2
(45) Date of Patent: Oct. 28, 2025

(54) SEMICONDUCTOR DEVICE WITH DEEP TRENCH ISOLATION

(71) Applicant: SK keyfoundry Inc., Cheongju-si (KR)

(72) Inventors: Kwang Il Kim, Cheongju-si (KR); Min Kuck Cho, Cheongju-si (KR); Jung Hwan Lee, Cheongju-si (KR); Yang Beom Kang, Cheongju-si (KR); Hyun Chul Kim, Cheongju-si (KR)

(73) Assignee: SK keyfoundry Inc., Cheongju-si (KR)

( * ) Notice: Subject to any disclaimer, the term of this patent is extended or adjusted under 35 U.S.C. 154(b) by 466 days.

(21) Appl. No.: 18/112,753

(22) Filed: Feb. 22, 2023

(65) Prior Publication Data

US 2023/0317777 A1   Oct. 5, 2023

(30) Foreign Application Priority Data

Aug. 31, 2022   (KR) .......................... 10-2022-0110168

(51) Int. Cl.
*H01L 29/00* (2006.01)
*H01L 23/48* (2006.01)
*H10D 62/10* (2025.01)

(52) U.S. Cl.
CPC ......... *H10D 62/115* (2025.01); *H01L 23/481* (2013.01)

(58) Field of Classification Search
CPC ............. H10D 62/115; H10D 84/0149; H10D 84/0151; H10D 84/038; H10D 84/83; H01L 23/481; H01L 21/76224; H01L 21/764; H10B 41/30; H10B 41/50; H10B 41/10; H10B 41/40

USPC ......................................................... 257/506
See application file for complete search history.

(56) References Cited

U.S. PATENT DOCUMENTS

| | | | |
|---|---|---|---|
| 8,772,935 B2 | 7/2014 | Yang | |
| 9,263,320 B2 | 2/2016 | Murata et al. | |
| 9,502,305 B2* | 11/2016 | Chen | ................. H01L 21/26513 |
| 9,508,814 B2* | 11/2016 | Wang | ................... H10D 30/601 |
| 9,922,865 B2 | 3/2018 | Lee et al. | |

(Continued)

FOREIGN PATENT DOCUMENTS

| | | |
|---|---|---|
| JP | 2015-138853 A | 7/2015 |
| KR | 10-2013-0101775 A | 9/2013 |

(Continued)

OTHER PUBLICATIONS

Korean Office Action issued on Dec. 14, 2023, in counterpart Korean Patent Application No. 10-2022-0110168 (6 pages in English, 6 pages in Korean).

*Primary Examiner* — Theresa T Doan
(74) *Attorney, Agent, or Firm* — NSIP Law

(57) ABSTRACT

A semiconductor device is provided. The semiconductor device includes a first region having a first gate structure disposed on a substrate and a second region having a second gate structure disposed on the substrate, a hard mask formed on the substrate, the first gate structure, and the second gate structure, a deep trench formed in the substrate between the first region and the second region, and formed to penetrate the hard mask to reach an inside of the substrate, and a planarized gap-fill insulating layer formed on the second gate structure and formed inside the deep trench. A topmost surface of the planarized gap-fill insulating layer and a topmost surface of the hard mask are coplanar.

18 Claims, 4 Drawing Sheets

(56) References Cited

U.S. PATENT DOCUMENTS 10,699,960 B2    6/2020   Su et al.
11,018,060 B2    5/2021   Kang et al.

FOREIGN PATENT DOCUMENTS

KR    10-2014-0119954 A    10/2014
KR    10-2020-0125873 A    11/2020

* cited by examiner

SEMICONDUCTOR DEVICE WITH DEEP TRENCH ISOLATION

CROSS-REFERENCE TO RELATED APPLICATIONS

This application claims the benefit under 35 U.S.C. 119(a) of Korean Patent Application No. 10-2022-0110168, filed on Aug. 31, 2022, in the Korean Intellectual Property Office, the entire disclosure of which is incorporated herein by reference for all purposes.

BACKGROUND

1. Field

The following description relates to a semiconductor device with a deep trench isolation.

2. Description of Related Art

For electrical isolation in a plurality of semiconductor devices in one chip, the structures of shallow trench isolation, deep trench isolation, and Junction isolation may be applied. When a deep trench isolation structure is implemented, a complicated process to fill the trench isolation structure may be implemented, and thus many masks may be necessary. Additionally, when the height of a gate structure formed on a substrate varies, the process may become more complicated.

SUMMARY

This Summary is provided to introduce a selection of concepts in a simplified form that is further described below in the Detailed Description. This Summary is not intended to identify key features or essential features of the claimed subject matter, nor is it intended to be used as an aid in determining the scope of the claimed subject matter.

In a general aspect, a semiconductor device includes a first region having a first gate structure disposed on a substrate; a second region having a second gate structure disposed on the substrate; a hard mask disposed on the substrate, the first gate structure, and the second gate structure; a deep trench isolation disposed in the substrate between the first region and the second region, and formed from the hard mask; and a planarized gap-fill insulating layer disposed on the second gate structure, and disposed inside the deep trench isolation, wherein a topmost surface of the planarized gap-fill insulating layer and a topmost surface of the hard mask are coplanar.

The device may include a capping insulating layer formed on the gap-fill insulating layer, and configured to be in direct contact with the planarized gap-fill insulating layer and the hard mask.

The device may include a first sidewall insulating layer disposed in the deep trench isolation; a second sidewall insulating layer formed on the first sidewall insulating layer; and a void surrounded by the second sidewall insulating layer, wherein the second sidewall insulating layer is in direct contact with the gap-fill insulating layer.

The device may include a first contact plug disposed in the first region, and a second contact plug disposed in the second region; and a first metal wiring connected to the first contact plug, and a second metal wiring connected to the second contact plug, wherein the first contact plug is configured to penetrate the hard mask, and wherein the second contact plug is configured to penetrate the hard mask and the gap-fill insulating layer.

The first gate structure may include a floating gate and a control gate, and the deep trench isolation may penetrate a shallow trench.

The planarized gap-fill insulating layer may be configured to overlap the second gate structure and does not overlap the first gate structure.

The device may include an etch stop layer disposed on the first gate structure and the second gate structure, wherein the deep trench isolation may penetrate the etch stop layer and the hard mask.

The hard mask may include a first doped oxide film comprising a first material; and a first undoped oxide film comprising a second material that is different from the first material, wherein a topmost surface of the planarized gap-fill insulating layer is coplanar with one of a topmost surface of the first doped oxide film and a topmost surface of the first undoped oxide film.

A height of the first gate structure may be greater than a height of the second gate structure, and a thickness of the hard mask that is disposed between the first gate structure and the deep trench isolation is greater than a thickness of the hard mask that is disposed in the second region.

In a general aspect, a semiconductor device includes a gate structure disposed on a substrate; a hard mask, comprising a first doped oxide film and a first undoped oxide film, and disposed on the substrate and the gate structure; a deep trench isolation that penetrates the first doped oxide film and the first undoped oxide film to reach an inside of the substrate; and a planarized gap-fill insulating layer disposed in the deep trench isolation, wherein a topmost surface of the planarized gap-fill insulating layer is coplanar with a topmost surface of the hard mask.

The device may include a capping insulating layer that is disposed on the planarized gap-fill insulating layer, wherein the capping insulating layer is in direct contact with both the planarized gap-fill insulating layer and the hard mask.

The device may include a first sidewall insulating layer disposed in the deep trench isolation; a second sidewall insulating layer disposed on the first sidewall insulating layer; and a void surrounded by the second sidewall insulating layer, wherein the second sidewall insulating layer is in direct contact with the planarized gap-fill insulating layer.

The planarized gap-fill insulating layer may overlap the deep trench isolation and does not overlap the gate structure.

The device may include a first contact plug disposed to be closer to the gate structure than to the deep trench isolation; and a second contact plug disposed to be closer to the deep trench isolation than to the gate structure, wherein the first contact plug is configured to penetrate the hard mask, and wherein the second contact plug is configured to penetrate the hard mask and the planarized gap-fill insulating layer.

The hard mask may include a first doped oxide film and a first undoped oxide film, and a topmost surface of the planarized gap-fill insulating layer may be coplanar with a topmost surface of one of the first doped oxide film and a topmost surface of the first undoped oxide film.

In a general aspect, a semiconductor device includes a first region, comprising a first gate structure of a first height; a second region, comprising a second gate structure of a second height different from the first height; an isolation region, disposed between the first region and the second region, and comprising at least one deep trench isolation; a gap-fill insulating layer, configured to overlap the second gate structure in a vertical direction, and fill the at least one deep trench isolation; and a hard mask, of variable thickness, configured to overlap the first gate structure and the second gate structure in the vertical direction; wherein the gap-fill insulating layer is disposed in areas of the first region that are external to an upper surface of the first gate structure.

The at least one deep trench isolation may be configured to penetrate the hard mask.

The hard mask may include a first doped oxide film layer and a first undoped oxide film layer.

Other features and aspects will be apparent from the following detailed description, the drawings, and the claims.

BRIEF DESCRIPTION OF THE DRAWINGS

Throughout the drawings and the detailed description, the same reference numerals refer to the same or like elements. The drawings may not be to scale, and the relative size, proportions, and depiction of elements in the drawings may be exaggerated for clarity, illustration, and convenience.

DETAILED DESCRIPTION

Figure 1:
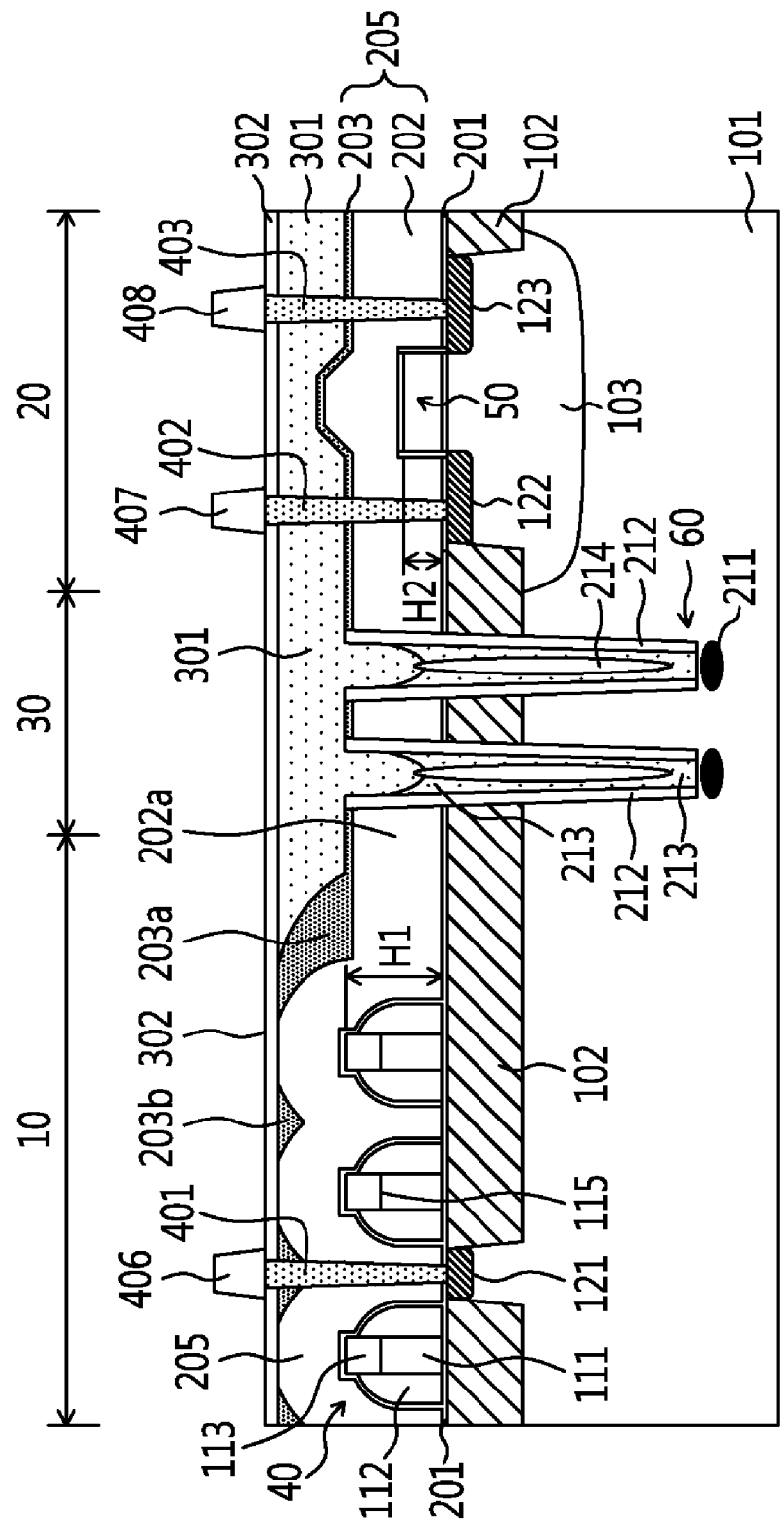
FIG. 1 illustrates a cross-sectional view of an example semiconductor device in accordance with one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. Likewise, expressions, for example, "between" and "immediately between" and "adjacent to" and "immediately adjacent to" may also be construed as described in the foregoing.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof. The use of the term "may" herein with respect to an example or embodiment (for example, as to what an example or embodiment may include or implement) means that at least one example or embodiment exists where such a feature is included or implemented, while all examples are not limited thereto.

Unless otherwise defined, all terms, including technical and scientific terms, used herein have the same meaning as commonly understood by one of ordinary skill in the art to which this disclosure pertains consistent with and after an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

A semiconductor device where a deep trench isolation (DTI) is formed between a first region and a second region may be provided.

A semiconductor device that minimizes a chip area may be provided.

Technical problems of the present disclosure are not limited to the technical problems mentioned above, and other technical problems not mentioned will be clearly understood by those having ordinary skill in the art from the following description.

Hereinafter, the one or more examples will be described in more detail based on examples shown in the drawings.

FIG. 1 illustrates a cross-sectional view of an example semiconductor device in accordance with one or more embodiments.

Referring to FIG. 1, the example semiconductor device may include a first region 10 having a first gate structure 40 that is disposed on a substrate 101; a second region 20 having a second gate structure 50 that is disposed on the substrate 101, and an isolation region 30 that is disposed between the first region 10 and the second region 20.

In an example, a first height H1 of the first gate structure 40 may be greater than a second height H2 of the second gate structure 50. In the semiconductor device, the first gate structure 40 may include a floating gate 111, a control gate 112, and a gate hard mask 113 to etch the floating gate 111. The floating gate 111 and the control gate 112 may be formed of conductivity materials, such as, but not limited to, polysilicon materials. The gate hard mask 113 may be formed of silicon oxide layers, silicon nitride layers, etc., as only examples.

In the first gate structure 40, the floating gate 111 may be surrounded by the control gate 112. In an example, the floating gate 111 may be positioned under the control gate 112. In an example, a gate hard mask 113 may be formed on the floating gate 111. The gate hard mask 113 may cover the top of the floating gate 111. The control gate 112 may surround the floating gate 111. In a non-limiting example, the control gate 112 may have a height that is different from a height of the floating gate 111. In an example, a height of the control gate 112 may be formed to be higher than a height of the floating gate 111. An oxide-nitride-oxide (ONO) dielectric layer 115 may be formed to isolate the floating gate 111 from the control gate 112.

Referring to FIG. 1, an inter-dielectric layer (ILD) may be formed on the first and second gate structures 40 and 50 before formation of the contact hole or contact plugs 401 to 403. The ILD may comprise an etch stop layer (ESL) 201, a hard mask 205, a planarized gap-fill insulating layer 301 and a capping insulating layer 302. As described above, the first gate structure 40 may have a first height H1. On the other hand, the second gate structure 50 may have a second height H2 which may be less than the first height H1. In a non-limited example, the first height H1 may be two or third times as large as the second height H2. Due the difference in heights between the first height H1 and the second height H2, the stacked layers over the first gate structure 40 and the second gate structure 50 may be different from each other. For example, in the first region 10, the etch stop layer (ESL) 201, the hard mask 205 and the capping insulating layer 302 may be stacked over the first gate structure 40. However, in second region 20, the gap-fill insulating layer 301 may be additionally stacked over the second gate structure 50, and may also be stacked over the etch stop layer (ESL) 201, the hard mask 205 and the capping insulating layer 302.

The etch stop layer (ESL) 201 may be formed to protect the first gate structure 40 and the second gate structure 50. In an example, the etch stop layer 201 may be continuously formed in the first region 10, second region 20, and isolation region 30. According to examples, for the ESL 201, SiN, SiO2, SiCN, SiOC or SiON may be implemented, and it may be formed at a thickness of about 20 nm to about 100 nm. The etch stop layer (ESL) 201 may prevent damage from occurring to the substrate from an over-etching process to form a contact hole. The etch stop layer 201 may be formed on the first gate structure 40 and the second gate structure 50.

The hard mask 205 may be implemented to form a plurality of deep trench isolations (DTIs) 60 as a hard mask, and the hard mask 205 may be formed on the etch stop layer 201. The hard mask 205 may include at least a thick hard mask insulating layer 202 and a thin hard mask insulating layer 203. The thick hard mask insulating layer 202 as a first doped oxide film may have a thickness that is greater than a thickness of the thin hard mask insulating layer 203 as a first undoped oxide film.

In an example, the thick hard mask insulating layer 202 may comprise a first material that is different from a second material of the thin hard mask insulating layer 203. In an example, boron phosphorus silicate glass (BPSG) may be implemented for the thick hard mask insulating layer 202 as the first doped oxide film. In an example, undoped silicate glass (USG) or a tetra ethyl ortho silicate, named tetraethoxysilane (TEOS), may be implemented for the thin hard mask insulating layer 203 as the first undoped oxide film.

The thin hard mask insulating layers 203a and 203b may be disposed on the thick hard mask insulating layer 202a in the first region 10. In an example, the thin hard mask insulating layers 203a and 203b may be spaced apart from each other due to a subsequent chemical and mechanical planarization (CMP) process. In an example, an interface between the thick hard mask insulating layer 202a and the thin hard mask insulating layer 203a may be formed to be curved.

The gap-fill insulating layer 301 as a second doped oxide film may be formed to gap-fill the DTIs 60. The gap-fill insulating layer 301 may be implemented with a doped oxide film, for example, BPSG film, which possesses superior gap-filling properties. The CMP process on the gap-fill insulating layer 301 may be performed to form a planarized hard mask layer 205 and a planarized gap-fill insulating layer 301 in the first region 10 and the second region 20, respectively. A topmost surface of the planarized gap-fill insulating layer 301 and a topmost surface of the hard mask 205 may be coplanar. In other words, a topmost surface of the gap-fill insulating layer 301 as a second doped oxide film may be coplanar with topmost surfaces of the first doped oxide film 202a and/or the first undoped oxide film 203a. The planarized gap-fill insulating layer 301 as a second doped oxide film may be in direct contact with the second sidewall insulating layer 213.

The planarized gap-fill insulating layer 301 may be removed from at least a portion of an upper surface of the first gate structure 40, but may remain on an upper surface of the second gate structure 50. Therefore, the planarized gap-fill insulating layer 301 may overlap the second gate structure 50 in a vertical direction. However, in an example, the planarized gap-fill insulating layer 301 may not vertically overlap the first gate structure 40.

The capping insulating layer 302 as a second undoped oxide film may be formed on the planarized gap-fill insulating layer 301 and the planarized hard mask layer 205. The capping insulating layer 302 may simultaneously be in direct contact with the planarized gap-fill insulating layer 301 and the planarized hard mask 205. The capping insulating layer 302 may be deposited with an undoped oxide film, for example, undoped silicate glass (USG) film or TEOS film by a plasma enhanced chemical vapor deposition (PECVD) method.

Referring to FIG. 1, a first contact plug 401 may be formed in the first region 10. A second contact plug 402 and a third contact plug 403 may respectively be formed in the second region 20. Additionally, a first metal wiring 406, a second metal wiring 407 and a third metal wiring 408 may be formed to electrically connect the first, second and third contact plugs 401, 402 and 403, respectively. The first contact plug 401 in the first region may be formed to penetrate the hard mask 205 and the capping insulating layer 302.

As described above, the planarized gap-fill insulating layer 301 may be removed from at least a portion of the upper surface of the first region 10, but may remain on an upper surface of the second region 20, so the respective second and third contact plugs 402 and 403 in the second region 20 may pass through the planarized gap-fill insulating layer 301, as well as the hard mask 205 and the capping insulating layer 302.

The first region 10 may include a highly doped region 121, the first contact plug 401, and the first metal wiring 406. The highly doped region 121 may be a region that is doped with an N-type, which is a first conductivity type.

The second region 20 may include a well region 103, which is of a second conductivity type, a highly doped drain region 122, and a highly doped source region 123, which are of a first conductivity type, and a gate electrode 50. The first conductivity type refers to an N-type, and the second conductivity type refers to a P-type. A gate insulating layer may be formed under the gate electrode 50. Additionally, a plurality of second contact plugs 402, 403, and a plurality of second metal wirings 407, 408, which are respectively connected to the drain region 122 and the source region 123, may be formed. The contact plugs 402, 403 may apply a constant voltage, such as a power voltage or a ground voltage.

Referring to FIG. 1, a shallow trench isolation 102 and a plurality of deep trench isolations (DTIs) 60 may be formed in the isolation region 30. The plurality of deep trench isolations 60 may be formed to penetrate the shallow trench isolation 102 in a direction toward the substrate 101. The DTIs 60 may be spaced apart from each other. The DTIs 60 may be disposed to isolate the first region 10 and second region 20 from each other. By implementing the DTIs 60, the DTIs 60 may help to reduce an entire chip area of the semiconductor device compared to the junction isolation.

The DTIs 60 may be formed by etching a predetermined depth from a top surface of the substrate 101, and may be formed to be inclined or tapered so that its width becomes narrower in the downward direction. That is because the concentration of an etching gas material decreases as an etching depth increases. In an example, the depths of the DTIs 60 may extend toward a bottom of the substrate 101 and, in an example, may be formed to be deeper than the well region 103. In one or more examples, the DTIs 60 may be formed by a two-step etching process.

The DTIs 60 may be formed in the substrate 101 between the first region 10 and the second region 20. The DTIs 60 may be formed to penetrate the shallow trench isolation 102, the etch stop layer 201 and the hard mask 205.

Each of the DTIs 60 may include a first sidewall insulating layer 212, a second sidewall insulating layer 213 formed on the first sidewall insulating layer 212, and a void 214 that is surrounded by the second sidewall insulating layer 213.

In the DTIs 60, the first sidewall insulating layer 212 may be deposited on a sidewall of the DTIs 60, and may be disposed or formed adjacent to the second sidewall insulating layer 213. The first sidewall insulating layer 212 may be formed with an undoped oxide film, as a non-limited example, USG or TEOS. The second sidewall insulating layer 213 may be formed with a doped oxide film, for example, BPSG. The first sidewall insulating layer 212 and the second sidewall insulating layer 213 may be deposited to narrow an entrance of the trench isolation 60 around top corners, resulting in a decrease of a width between the top corners.

An air gap or a void 214 may be formed inside the DTIs 60. The air gap or void 214 may increase the isolation capability from one device to another device which are respectively formed in the first region 10 and the second region 20.

A channel stop region 211 may be formed near, or adjacent to, a bottom surface of the DTIs 60 by performing channel stop implantation to block a leakage current between two adjacent devices.

As described above, the one or more examples disclose a semiconductor device including an isolation region 30 where the DTIs 60 are formed between the first region 10 and the second region 20. Accordingly, a device chip area may be configured to be smaller while withstanding a sufficiently high breakdown voltage (i.e., about 12 V to about 111 V), compared to typical semiconductor device structures where a junction isolation is formed.

Figure 2:
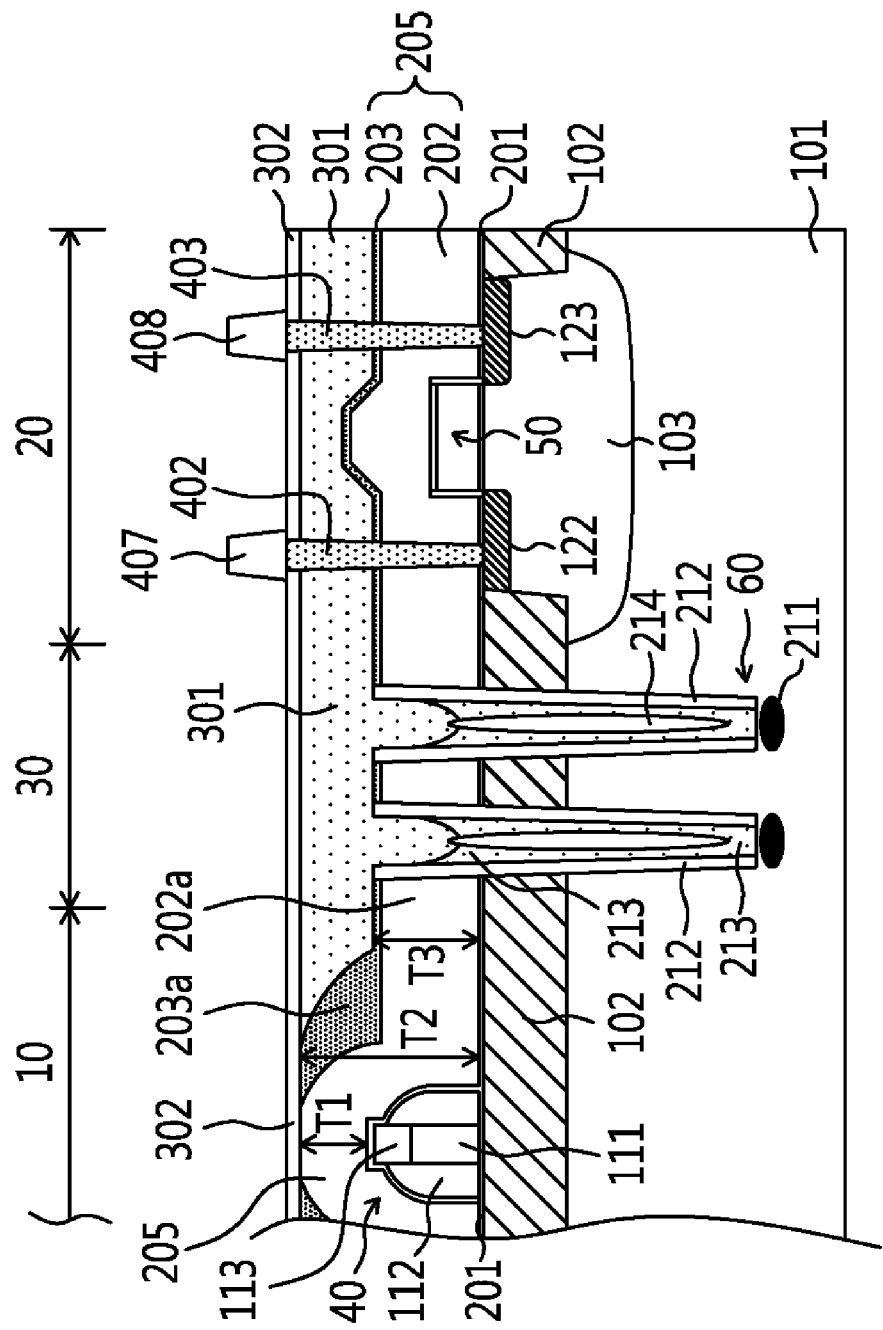
FIG. 2 illustrates an enlarged view of the example semiconductor device of FIG. 1 in accordance with one or more embodiments.

FIG. 2 illustrates an enlarged view of the example semiconductor device of FIG. 1, in accordance with one or more embodiments.

Referring to FIG. 2, the hard mask 205 to etch the DTIs 60 may have various thicknesses depending on location of the hard mask 205. For example, in the first region 10, the hard mask 205 may have a first thickness T1, a second thickness T2 or a third thickness T3. The first thickness T1, which is adjacent to the gate hard mask 113, may be a distance from a top surface of the ESL 201 to the capping insulating layer 302. The second thickness T2, which is adjacent to the control gate 112, may be a distance from the top surface of the ESL 201 to the capping insulating layer 302. The third thickness T3, which is adjacent to the DTIs 60, may be a distance from the top surface of the ESL 201 to the planarized gap-fill insulating layer 301.

In the one or more examples, the second thickness T2 may include both the thin and thick hard mask insulating layers 202a and 203a. On the other hand, the first thickness T1 or the third thickness T3 may include only the thick hard mask insulating layers 202a. In an example, the second thickness T2 may be greater than the first thickness T1 or the third thickness T3. The various thicknesses of the hard mask 205 may be obtained after the chemical and mechanical planarization process (CMP) performed on the hard mask 205 and the gap-fill insulating layer 301.

As described above, the respective thick and thin hard mask insulating layers 202 and 203 may be formed of materials that are different from each other. The thick hard mask insulating layer 202 may be implemented by a first doped oxide film, such as boron phosphorus silicate glass (BPSG) film, as examples. The thin hard mask insulating layer 203 may employ a first undoped oxide film, such as undoped silicate glass (USG) film or a tetra ethyl ortho silicate, named tetraethoxysilane (TEOS) film. The gap-fill insulating layer 301 may employ a second doped oxide film, such as BPSG film, as an example. The capping insulating layer 302 may implement a second undoped oxide, such as undoped silicate glass (USG) film or TEOS film. Therefore, the first doped oxide film (thick hard mask insulating layer) 202, the first undoped oxide film (thin hard mask insulating layer) 203, the second doped oxide film (the gap-fill insulating layer) 301 and the second undoped oxide film (the capping insulating layer) 302 may be sequentially disposed over the second gate structure 50 in the second region 20.

On the other hand, the second doped oxide film 301 may be omitted in the first region due to the CMP process. Accordingly, the first doped oxide film (thick hard mask insulating layer) 202a, the first undoped oxide film (thick hard mask insulating layer) 203a and the second undoped oxide film (the capping insulating layer) 302 may be sequentially disposed over the first gate structure 40 in the first region 10, without the second doped oxide film (the gap-fill insulating layer) 301.

Figure 3:
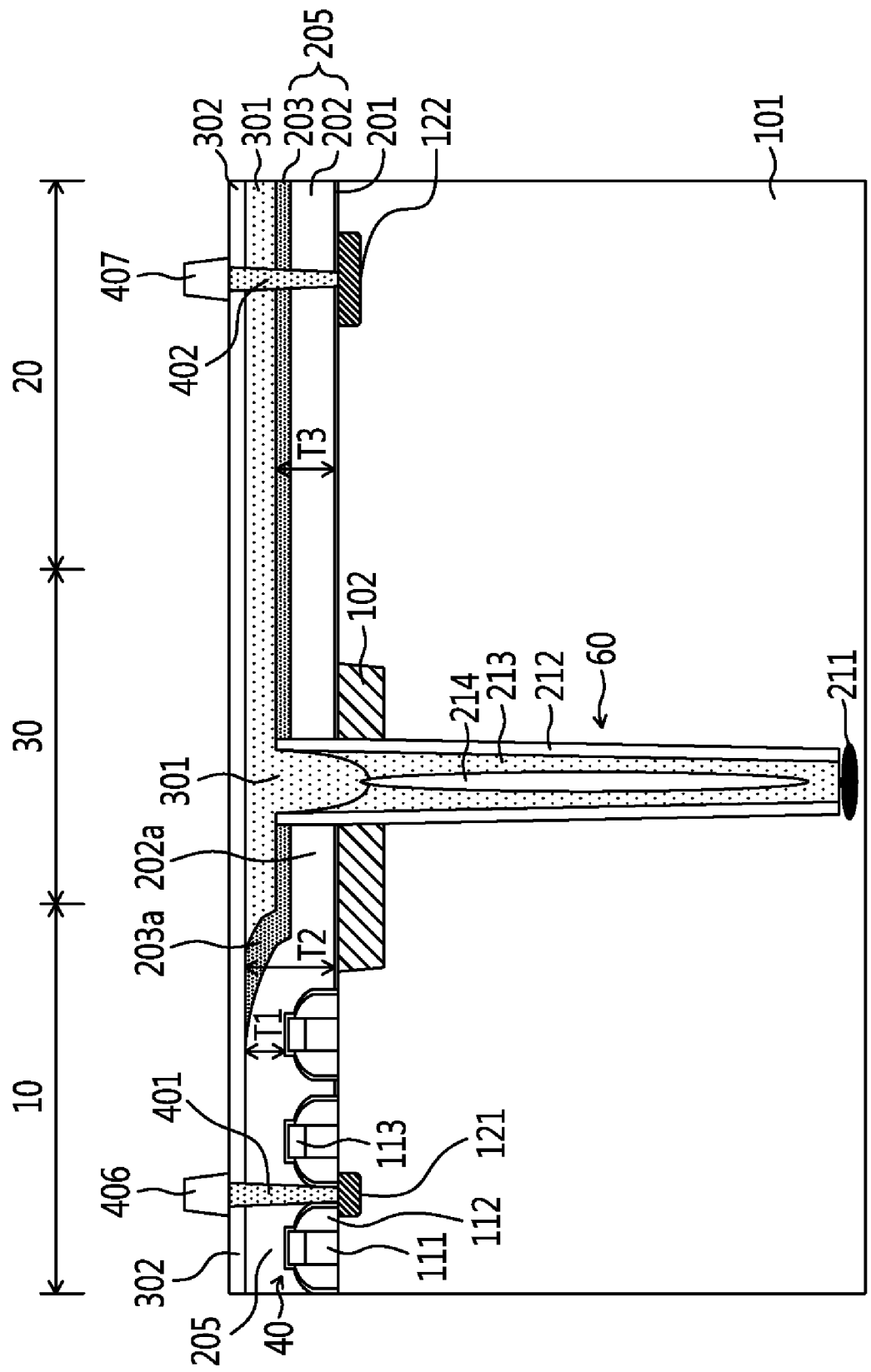
FIG. 3 illustrates a cross-sectional view of an example semiconductor device in accordance with one or more embodiments.

FIG. 3 illustrates a cross-sectional view of an example semiconductor device, in accordance with one or more embodiments. The example semiconductor device of FIG. 3 is similar to the structure of FIG. 1 except for the implementing of the one deep trench isolation (DTI) 60. Since the example semiconductor device is similar to the structure of FIG. 1, the same structure will be described with the same reference numerals as those of the above-indicated example.

Referring to FIG. 3, a semiconductor device may include a gate structure 40 formed on a substrate 101, a hard mask 205 formed on the gate structure 40, the DTI 60 formed to divide the hard mask 205, and a planarized gap-fill insulating layer 301 formed inside the DTI 60. A topmost surface of the planarized gap-fill insulating layer 301 and a topmost surface of the hard mask 205 may be coplanar. In other words, a topmost surface of the gap-fill insulating layer 301 as a second doped oxide film is coplanar with topmost surfaces of the first doped oxide film 202a and/or the first undoped oxide film 203a.

The semiconductor device may further include a capping insulating layer 302 that is formed on the planarized gap-fill insulating layer 301. The capping insulating layer 302 may simultaneously be in direct contact with the planarized gap-fill insulating layer 301 and the hard mask 205.

The semiconductor device may further include a first sidewall insulating layer 212 that is formed inside the DTI 60, a second sidewall insulating layer 213, that is formed on the first sidewall insulating layer 212. Additionally, a void 214 may be surrounded by the second sidewall insulating layer 213. In an example, the second sidewall insulating layer 213 may be in direct contact with the planarized gap-fill insulating layer 301. The planarized gap-fill insulating layer 301 may be formed to gap-fill the DTI 60. In an example, the planarized gap-fill insulating layer 301 may be removed from an upper surface of the gate structure 40.

The semiconductor device may further include a first contact plug 401 that may be formed closer to the gate structure 40 than to the DTI 60, and a second contact plug 402 that may be formed closer to the DTI 60 than to the gate structure 40. The first contact plug 401 may be formed to penetrate a capping insulating layer 302 and the hard mask 205, and the second contact plug 402 may be formed to penetrate the capping insulating layer 302, the hard mask 205, and the planarized gap-fill insulating layer 301.

The thickness of the hard mask 205 for the DTI 60 may vary depending on a determined position of the hard mask 205. For example, the hard mask 205 that is formed on the gate structure 40 may have a first thickness T1. The hard mask 205 that is formed near the shallow trench isolation 102 may have second thickness T2. The hard mask 205 that is formed near the second contact plug 402 may have a third thickness T3. In an example, the first thickness T1 may be less than the third thickness T3.

Figure 4:
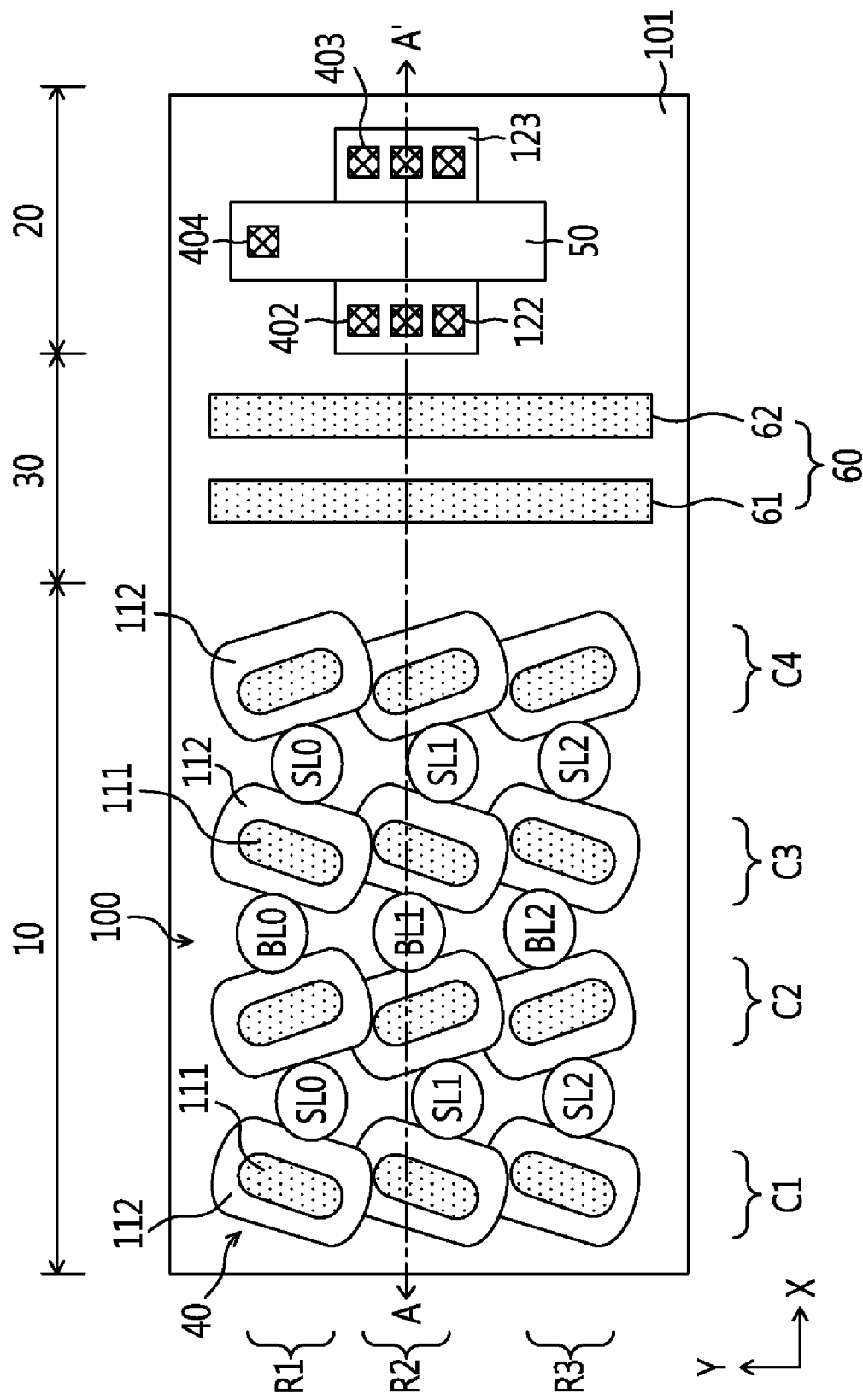
FIG. 4 illustrates a plan view of an example semiconductor device in accordance with one or more embodiments.

FIG. 4 illustrates a plan view of an example semiconductor device, in accordance with one or more embodiments.

Referring to FIG. 4, in a plan view, an example semiconductor device includes a first region 10, a second region 20, and an isolation region 30.

Referring to FIG. 4, a first region 10 includes a cell array 100 that is formed of a plurality of cells. The cell array 100 may be formed of a plurality of rows R1, R2, R3 and a plurality of columns C1, C2, C3 and C4. Each of the columns C1, C2, C3 and C4 may include a plurality of floating gates 111 and control gates 112 surrounding the floating gates 111 in a y-axis direction. In a non-limiting example, the floating gate 111 nay be arranged to be tilted in a left direction or in a right direction with respect to the y-axis. In the cell array 100, odd numbered columns C1 and C3 and even numbered columns C2 and C4 may have a floating gate structure that is symmetrical to each other with respect to a source line contact SL0, SL1 or SL2. In other words, the floating gates of the odd numbered columns and even numbered columns may have different directions. Specifically, the floating gates of the first column C1 and the third column C3 may be positively tilted with respect to the y-axis direction, and the floating gates of the second column C2 and the fourth column C4 may be negatively tilted with respect to the y-axis direction. More cells may be included in the same area if the floating gate 112 is arranged to be tilted.

The cell array 100 may include source line contacts SL0 SL2, and bit line contacts BL0~BL2. The source line contacts SL0~SL2 may all be electrically connected to source lines, and the bit line contacts BL0~BL2 may all be electrically connected to bit lines.

Referring to FIG. 4, in the second region 20, an active region including a source region 122 and a drain region 123 may be formed in a substrate 101. Each source region 122 and drain region 123 of the active region may be formed using an active mask pattern. A source contact plug 402 and a drain contact plug 403 may be formed in the source region 122 and the drain region 123, respectively. The source contact plug 402 and the drain contact plug 403 may be connected to metal wirings described above.

A logic gate electrode for the second gate structure 50 may be formed between the drain region 122 and the source region 123. A gate contact plug 404 may be formed in the gate electrode 50.

Referring to FIG. 4, an isolation region 30 may be formed between the first region 10 and the second region 20. The isolation region 30 is a region for isolation between the first region 10 and the second region 20. In one or more examples, DTIs 60 may comprise a first deep trench isolation 61 and a second deep trench isolation 62. The respective first and second deep trench isolations 61 and 62 may be spaced apart from each other. Additional deep trench isolations may be added in the isolation region 30. Gap-fill insulating materials may be formed to fill the DTIs 60, and an air-gap or void may be formed inside the DTIs 60, as illustrated in FIGS. 1, 2 and 3. Accordingly, if a semiconductor device is implemented in a substrate including the isolation region 30 between the first region 10 and the second region 20, where the predetermined number of deep trench isolations 60 (61 and 62) are formed, a semiconductor device may be implemented while reducing an integrated circuit (IC) chip area, compared to the typical semiconductor device.

In the one or more examples, since, between a first region and a second region, an isolation region where a deep trench isolation is formed is provided, a semiconductor device having a small chip area, and that may sufficiently withstand high pressure, may be manufactured.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device, comprising:
    a first region having a first gate structure disposed on a substrate;
    a second region having a second gate structure disposed on the substrate;
    a hard mask disposed on the substrate, the first gate structure, and the second gate structure;
    a deep trench isolation disposed in the substrate between the first region and the second region, and formed from the hard mask; and
    a planarized gap-fill insulating layer disposed on the second gate structure, and disposed inside the deep trench isolation,
    wherein a topmost surface of the planarized gap-fill insulating layer and a topmost surface of the hard mask are coplanar.

2. The device of claim 1, further comprising a capping insulating layer disposed on the gap-fill insulating layer, and configured to be in direct contact with the planarized gap-fill insulating layer and the hard mask.

3. The device of claim 1, further comprising:
    a first sidewall insulating layer disposed in the deep trench isolation;
    a second sidewall insulating layer disposed on the first sidewall insulating layer; and
    a void surrounded by the second sidewall insulating layer,
    wherein the second sidewall insulating layer is in direct contact with the gap-fill insulating layer.

4. The device of claim 1, further comprising:
    a first contact plug disposed in the first region, and a second contact plug disposed in the second region; and
    a first metal wiring connected to the first contact plug, and a second metal wiring connected to the second contact plug,
    wherein the first contact plug is configured to penetrate the hard mask, and
    wherein the second contact plug is configured to penetrate the hard mask and the gap-fill insulating layer.

5. The device of claim 1,
    wherein the first gate structure comprises a floating gate and a control gate, and
    wherein the deep trench isolation penetrates a shallow trench.

6. The device of claim 1, wherein the planarized gap-fill insulating layer is configured to overlap the second gate structure and does not overlap the first gate structure.

7. The device of claim 1, further comprising:
    an etch stop layer disposed on the first gate structure and the second gate structure, wherein the deep trench isolation penetrates the etch stop layer and the hard mask.

8. The device of claim 1,
    wherein the hard mask comprises:
    a first doped oxide film comprising a first material; and
    a first undoped oxide film comprising a second material that is different from the first material,
    wherein a topmost surface of the planarized gap-fill insulating layer is coplanar with one of a topmost surface of the first doped oxide film and a topmost surface of the first undoped oxide film.

9. The device of claim 1, wherein a height of the first gate structure is greater than a height of the second gate structure, and
    wherein a thickness of the hard mask that is disposed between the first gate structure and the deep trench isolation is greater than a thickness of the hard mask that is disposed in the second region.

10. A semiconductor device comprising:
    a gate structure disposed on a substrate;
    a hard mask, comprising a first doped oxide film and a first undoped oxide film, and disposed on the substrate and the gate structure;
    a deep trench isolation that penetrates the first doped oxide film and the first undoped oxide film to reach an inside of the substrate; and
    a planarized gap-fill insulating layer disposed in the deep trench isolation,
    wherein a topmost surface of the planarized gap-fill insulating layer is coplanar with a topmost surface of the hard mask.

11. The device of claim 10, further comprising:
    a capping insulating layer disposed on the planarized gap-fill insulating layer,
    wherein the capping insulating layer is in direct contact with both the planarized gap-fill insulating layer and the hard mask.

12. The device of claim 10, further comprising:
    a first sidewall insulating layer disposed in the deep trench isolation;
    a second sidewall insulating layer disposed on the first sidewall insulating layer; and
    a void surrounded by the second sidewall insulating layer,
    wherein the second sidewall insulating layer is in direct contact with the planarized gap-fill insulating layer.

13. The device of claim 10, wherein the planarized gap-fill insulating layer overlaps the deep trench isolation and does not overlap the gate structure.

14. The device of claim 10, further comprising:
    a first contact plug disposed to be closer to the gate structure than to the deep trench isolation; and
    a second contact plug disposed to be closer to the deep trench isolation than to the gate structure,
    wherein the first contact plug is configured to penetrate the hard mask, and wherein the second contact plug is configured to penetrate the hard mask and the planarized gap-fill insulating layer.

15. The device of claim 10, wherein a topmost surface of the planarized gap-fill insulating layer is coplanar with a topmost surface of one of the first doped oxide film and a topmost surface of the first undoped oxide film.

16. A semiconductor device, comprising:
a first region, comprising a first gate structure of a first height;
a second region, comprising a second gate structure of a second height different from the first height;
an isolation region, disposed between the first region and the second region, and comprising at least one deep trench isolation;
a gap-fill insulating layer, configured to overlap the second gate structure in a vertical direction, and fill the at least one deep trench isolation; and
a hard mask, of variable thickness, configured to overlap the first gate structure and the second gate structure in the vertical direction;
wherein the gap-fill insulating layer is disposed in areas of the first region that are external to an upper surface of the first gate structure.

17. The semiconductor device of claim 16, wherein the at least one deep trench isolation is configured to penetrate the hard mask.

18. The semiconductor device of claim 16, wherein the hard mask comprises a first doped oxide film layer and a first undoped oxide film layer.

* * * * *